United States Patent
Cho et al.

(10) Patent No.: US 9,515,702 B2
(45) Date of Patent: Dec. 6, 2016

(54) DEMODULATORS FOR NEAR FIELD COMMUNICATION, NEAR FIELD COMMUNICATION DEVICES, AND ELECTRONIC DEVICES HAVING THE SAME

(71) Applicants: Jong-Pil Cho, Hwaseong-si (KR); Ji-Myung Na, Suwon-si (KR); Il-jong Song, Suwon-si (KR)

(72) Inventors: Jong-Pil Cho, Hwaseong-si (KR); Ji-Myung Na, Suwon-si (KR); Il-jong Song, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/741,321

(22) Filed: Jun. 16, 2015

(65) Prior Publication Data

US 2016/0134333 A1 May 12, 2016

(30) Foreign Application Priority Data

Nov. 12, 2014 (KR) .................. 10-2014-0156918

(51) Int. Cl.
*H04B 5/00* (2006.01)
*H03D 1/10* (2006.01)
*H03D 1/12* (2006.01)
*H03D 1/22* (2006.01)

(52) U.S. Cl.
CPC .............. *H04B 5/0031* (2013.01); *H03D 1/10* (2013.01); *H03D 1/12* (2013.01); *H03D 1/22* (2013.01)

(58) Field of Classification Search
CPC .... G06K 19/0723; G06K 7/008; H04B 5/02; H04B 5/0012; H04B 5/00; H04B 5/0031
USPC ............. 455/41, 1, 41.2, 41.3, 550.1, 556.1, 455/557, 333
See application file for complete search history.

(56) References Cited

U.S. PATENT DOCUMENTS

| | | |
|---|---|---|
| 6,198,361 B1 | 3/2001 | Arisawa |
| 6,848,620 B2 | 2/2005 | Nakane et al. |
| 7,884,723 B2 | 2/2011 | Jung et al. |
| 8,188,787 B2 | 5/2012 | Wilson et al. |
| 8,699,949 B2 | 4/2014 | Thevenon et al. |
| 8,729,960 B2 | 5/2014 | Ochoa et al. |
| 2008/0191783 A1* | 8/2008 | Sudjian ............... H03L 7/0896 327/536 |

(Continued)

FOREIGN PATENT DOCUMENTS

| | | |
|---|---|---|
| JP | 1999-073481 | 3/1999 |
| JP | 1999-232418 | 8/1999 |

(Continued)

*Primary Examiner* — Nhan Le
(74) *Attorney, Agent, or Firm* — Harness, Dickey & Pierce, P.L.C.

(57) ABSTRACT

A demodulator for near field communication may include: a scale down circuit configured to receive first and second modulated signals from first and second power electrodes, and configured to provide a scale down signal to a first node by scaling down magnitudes of the first and second modulated signals; a current source coupled between the first node and a ground voltage, and configured to generate a constant current flowing from the first node to the ground voltage; a charge store circuit coupled between the first node and ground voltage, and configured to perform charge and discharge operations alternately, based on the scale down signal and constant current, to output an envelope signal, which corresponds to an envelope of the scale down signal; and/or an edge detector configured to generate input data, which correspond to the first and second modulated signals, based on a transition of the envelope signal.

20 Claims, 12 Drawing Sheets

(56) References Cited

U.S. PATENT DOCUMENTS

2009/0295353 A1* 12/2009 De Lima Filho ..... H02M 3/158 323/284
2013/0127556 A1* 5/2013 Hori ........................ H03F 3/189 332/106

FOREIGN PATENT DOCUMENTS

| JP | 5053310 B2 | 10/2012 |
| JP | 5107777 B2 | 12/2012 |
| JP | 5290014 B2 | 9/2013 |

* cited by examiner

DEMODULATORS FOR NEAR FIELD COMMUNICATION, NEAR FIELD COMMUNICATION DEVICES, AND ELECTRONIC DEVICES HAVING THE SAME

CROSS-REFERENCE TO RELATED APPLICATION(S)

This application claims priority from Korean Patent Application No. 10-2014-0156918, filed on Nov. 12, 2014, in the Korean Intellectual Property Office (KIPO), the entire contents of which are incorporated herein by reference.

BACKGROUND

1. Field

Some example embodiments may relate generally to wireless communication technologies. Some example embodiments may relate generally to demodulators for near field communication (NFC). Some example embodiments may relate generally to NFC devices including demodulators for NFC. Some example embodiments may relate generally to electronic devices including NFC devices that include demodulators for NFC.

2. Description of Related Art

Recently, as near field communication (NFC) technology, which is one of wireless communication technologies, has been developed, NFC devices may be extensively employed in mobile devices.

As the size of mobile devices decreases, antennas included in NFC devices may be required to be smaller.

When sizes of antennas included in NFC devices decreases, magnitudes of antenna voltages generated at the antennas based on electromagnetic waves also decreases, such that communication distances of the NFC devices decreases.

SUMMARY

Some example embodiments may provide demodulators for near field communication (NFC) to increase communication distances.

Some example embodiments may provide NFC devices including demodulators to increase communication distances.

Some example embodiments may provide electronic devices including NFC devices that include demodulators to increase communication distances.

In some example embodiments, a demodulator for near field communication (NFC) may comprise: a scale down circuit configured to receive a first modulated signal and a second modulated signal from a first power electrode and a second power electrode, respectively, and configured to provide a scale down signal to a first node by scaling down a magnitude of the first modulated signal and a magnitude of the second modulated signal; a current source coupled between the first node and a ground voltage, and configured to generate a constant current flowing from the first node to the ground voltage; a charge store circuit coupled between the first node and the ground voltage, and configured to perform a charge operation and a discharge operation alternately, based on the scale down signal and the constant current, to output an envelope signal, which corresponds to an envelope of the scale down signal, through the first node; and/or an edge detector configured to generate input data, which correspond to the first modulated signal and the second modulated signal, based on a transition of the envelope signal.

In some example embodiments, the demodulator may further comprise: a voltage clamp circuit configured to generate the first modulated signal and the second modulated signal by clamping a first antenna voltage and a second antenna voltage received from outside of the demodulator through the first power electrode and the second power electrode, respectively.

In some example embodiments, the voltage clamp circuit may comprise: a first diode coupled between the first power electrode and the ground voltage; and/or a second diode coupled between the second power electrode and the ground voltage.

In some example embodiments, the magnitude of the first modulated signal may be the same as the magnitude of the second modulated signal. A phase of the first modulated signal may be different from a phase of the second modulated signal by 180 degrees.

In some example embodiments, the scale down circuit may be further configured to generate the scale down signal by scaling down the magnitude of the first modulated signal and the magnitude of the second modulated signal by a same ratio.

In some example embodiments, the scale down circuit may be further configured to generate the scale down signal by scaling down the magnitude of the first modulated signal and the magnitude of the second modulated signal by one half.

In some example embodiments, the scale down circuit may comprise: a first resistor coupled between the first power electrode and the first node; and/or a second resistor coupled between the second power electrode and the first node.

In some example embodiments, a resistance of the first resistor may be the same as a resistance of the second resistor.

In some example embodiments, the charge store circuit may comprise: a capacitor coupled between the first node and the ground voltage.

In some example embodiments, the demodulator may further comprise: a rectification circuit configured to receive the first modulated signal and the second modulated signal from the first power electrode and the second power electrode, respectively, and configured to provide a rectified signal to the first node by rectifying the first modulated signal and the second modulated signal.

In some example embodiments, the rectification circuit may comprise: a first diode coupled between the first power electrode and the first node; and/or a second diode coupled between the second power electrode and the first node.

In some example embodiments, a threshold voltage of the first diode may be the same as a threshold voltage of the second diode.

In some example embodiments, the demodulator may further comprise: a bias circuit coupled to the first power electrode, the second power electrode, and the ground voltage. The bias circuit may be configured to provide bias voltage corresponding to the ground voltage to the first power electrode and the second power electrode.

In some example embodiments, the bias circuit may comprise: a first n-type metal oxide semiconductor (NMOS) transistor having a drain coupled to the first power electrode, a source coupled to the ground voltage, and a gate coupled to the second power electrode; and/or a second NMOS transistor having a drain coupled to the second power electrode, a source coupled to the ground voltage, and a gate coupled to the first power electrode.

In some example embodiments, a near field communication (NFC) device may comprise: a resonance circuit configured to generate an antenna voltage based on an electromagnetic wave received from an external device; and/or an NFC chip configured to communicate data with the external device based on the antenna voltage. The NFC chip may comprise a demodulator configured to receive the antenna voltage from the resonance circuit, configured to generate a scale down signal by scaling down a magnitude of the antenna voltage, configured to generate an envelope signal corresponding to an envelope of the scale down signal, and configured to generate input data corresponding to the antenna voltage based on the envelope signal.

In some example embodiments, the antenna voltage may comprise a first antenna voltage and a second antenna voltage, wherein a magnitude of the first antenna voltage is the same as a magnitude of the second antenna voltage, and wherein a phase of the first antenna voltage is different from a phase of the second antenna voltage by 180 degrees. The demodulator may be further configured to receive the first antenna voltage and the second antenna voltage from the resonance circuit through a first power electrode and a second power electrode, respectively.

In some example embodiments, the demodulator may comprise: a voltage clamp circuit configured to generate a first modulated signal and a second modulated signal by clamping the first antenna voltage and the second antenna voltage received through the first power electrode and the second power electrode, respectively; a scale down circuit configured to provide the scale down signal to a first node by scaling down a magnitude of the first modulated signal and a magnitude of the second modulated signal; a current source coupled between the first node and a ground voltage, and configured to generate a constant current flowing from the first node to the ground voltage; a charge store circuit coupled between the first node and the ground voltage, and configured to perform a charge operation and a discharge operation alternately, based on the scale down signal and the constant current, to output the envelope signal, which corresponds to the envelope of the scale down signal, through the first node; and/or an edge detector configured to generate the input data based on a transition of the envelope signal.

In some example embodiments, the scale down circuit may be further configured to generate the scale down signal by scaling down the magnitude of the first modulated signal and the magnitude of the second modulated signal by a same ratio.

In some example embodiments, the scale down circuit may be further configured to generate the scale down signal by scaling down the magnitude of the first modulated signal and the magnitude of the second modulated signal by one half.

In some example embodiments, the scale down circuit may comprise: a first resistor coupled between the first power electrode and the first node; and/or a second resistor coupled between the second power electrode and the first node.

In some example embodiments, a resistance of the first resistor may be the same as a resistance of the second resistor.

In some example embodiments, the resonance circuit may comprise: an antenna coupled between a first node and a second node; a first capacitor coupled between the first node and the second node; a second capacitor coupled between the first node and the first power electrode; and/or a third capacitor coupled between the second node and the second power electrode.

In some example embodiments, an electronic device may comprise: a near field communication (NFC) device configured to communicate with an external device through NFC; a memory device configured to store input data; and/or an application processor configured to control operations of the NFC device and the memory device. The NFC device may comprise: a resonance circuit configured to generate an antenna voltage based on an electromagnetic wave received from the external device; and/or an NFC chip configured to communicate data with the external device based on the antenna voltage. The NFC chip may comprise: a demodulator configured to receive the antenna voltage from the resonance circuit, configured to generate a scale down signal by scaling down a magnitude of the antenna voltage, configured to generate an envelope signal corresponding to an envelope of the scale down signal, and configured to generate the input data corresponding to the antenna voltage based on the envelope signal.

In some example embodiments, a demodulator may comprise: a circuit configured to receive a first modulated signal from a first power electrode, configured to receive a second modulated signal from a second power electrode, configured to provide a scale down signal to a first node by scaling down a magnitude of the first modulated signal and a magnitude of the second modulated signal, configured to cause a constant current to flow from the first node to a ground voltage, configured to output an envelope signal, corresponding to an envelope of the scale down signal, through the first node, and configured to generate input data based on a transition of the envelope signal.

In some example embodiments, the circuit may be further configured to alternately perform charging and discharging operations.

In some example embodiments, the charging operations may be based on the scale down signal.

In some example embodiments, the charging operations may be based on the constant current.

In some example embodiments, the discharging operations may be based on the scale down signal.

In some example embodiments, the discharging operations may be based on the constant current.

BRIEF DESCRIPTION OF THE DRAWINGS

The above and/or other aspects and advantages will become more apparent and more readily appreciated from the following detailed description of example embodiments, taken in conjunction with the accompanying drawings, in which.

DETAILED DESCRIPTION

Figure 1:
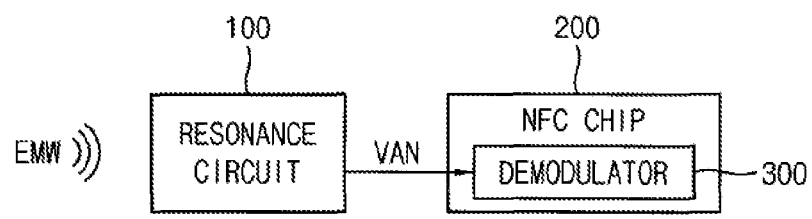
FIG. 1 is a block diagram illustrating a near field communication (NFC) device according to some example embodiments.

Example embodiments will now be described more fully with reference to the accompanying drawings. Embodiments, however, may be embodied in many different forms and should not be construed as being limited to the embodiments set forth herein. Rather, these example embodiments are provided so that this disclosure will be thorough and complete, and will fully convey the scope to those skilled in the art. In the drawings, the thicknesses of layers and regions may be exaggerated for clarity.

It will be understood that when an element is referred to as being "on," "connected to," "electrically connected to," or "coupled to" to another component, it may be directly on, connected to, electrically connected to, or coupled to the other component or intervening components may be present. In contrast, when a component is referred to as being "directly on," "directly connected to," "directly electrically connected to," or "directly coupled to" another component, there are no intervening components present. As used herein, the term "and/or" includes any and all combinations of one or more of the associated listed items.

It will be understood that although the terms first, second, third, etc., may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section. For example, a first element, component, region, layer, and/or section could be termed a second element, component, region, layer, and/or section without departing from the teachings of example embodiments.

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting of example embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

Example embodiments may be described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will typically have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature, their shapes are not intended to illustrate the actual shape of a region of a device, and their shapes are not intended to limit the scope of the example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Reference will now be made to example embodiments, which are illustrated in the accompanying drawings, wherein like reference numerals may refer to like components throughout.

FIG. 1 is a block diagram illustrating a near field communication (NFC) device according to some example embodiments.

An NFC device 10 illustrated in FIG. 1 communicates with an external device through an NFC scheme. In some example embodiments, the NFC device 10 may alternately perform an operation of detecting whether an NFC card is near the NFC device 10 and an operation of detecting whether an NFC reader is near the NFC device 10.

When the NFC device 10 detects an NFC reader near the NFC device 10, the NFC device 10 may operate in a card mode, in which the NFC device 10 operates as a card. In the card mode, the NFC device 10 may communicate data with the NFC reader based on an electromagnetic wave EMW emitted from the NFC reader.

When the NFC device 10 detects an NFC card near the NFC device 10, the NFC device 10 may operate in a reader mode, in which the NFC device 10 operates as a reader. In the reader mode, the NFC device 10 may emit an electromagnetic wave EMW to communicate data with the NFC card.

Referring to FIG. 1, the NFC device 10 includes a resonance circuit 100 and an NFC chip 200.

In the card mode, the resonance circuit 100 may communicate data with the NFC reader based on the electromagnetic wave EMW received from the NFC reader. Since the NFC reader includes a resonance circuit that includes an antenna having an inductive component and a resonance capacitor having a capacitive component, a mutual induction may occur between the resonance circuit 100 and the NFC reader, which is located near the resonance circuit 100, when the resonance circuit 100 receives the electromagnetic wave EMW from the NFC reader.

Therefore, an antenna voltage VAN may be generated by the resonance circuit 100 through the mutual induction with the NFC reader. The resonance circuit 100 may provide the antenna voltage VAN to the NFC chip 200.

The NFC chip 200 may include a demodulator 300 to perform a receive operation. For example, the demodulator 300 may demodulate the antenna voltage VAN to generate input data.

The demodulator 300 may receive the antenna voltage VAN from the resonance circuit 100, may generate a scale down signal by scaling down a magnitude of the antenna voltage VAN, may generate an envelope signal corresponding to an envelope of the scale down signal, and may generate the input data corresponding to the antenna voltage VAN based on the envelope signal.

In the NFC scheme, an amplitude shift keying (ASK) modulation is used to communicate data. Therefore, the demodulator 300 may generate the input data corresponding to the antenna voltage VAN by detecting a transition of the envelope signal.

A structure and an operation of the demodulator 300 will be described later.

Figure 2:
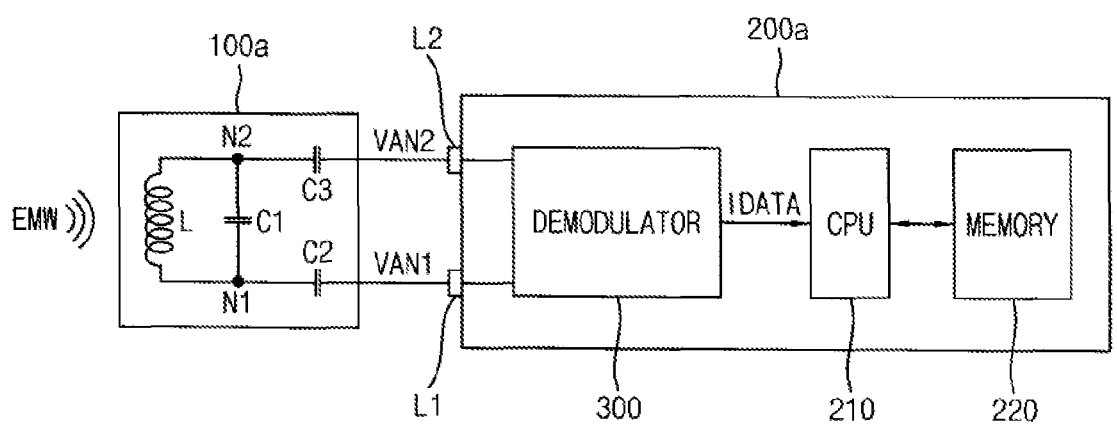
FIG. 2 is a block diagram illustrating an example embodiment of an NFC device of FIG. 1.

FIG. 2 is a block diagram illustrating an example embodiment of an NFC device of FIG. 1.

Referring to FIG. 2, an NFC device 10*a* may include a resonance circuit 100*a* and an NFC chip 200*a*.

The NFC chip 200*a* may be connected to the resonance circuit 100*a* through a first power electrode L1 and a second power electrode L2.

The resonance circuit 100*a* may include an antenna L, a first capacitor C1, a second capacitor C2, and a third capacitor C3.

The antenna L and the first capacitor C1 may be coupled in parallel between a first node N1 and a second node N2.

The antenna L and the first capacitor C1 may have a resonance frequency. In some example embodiments, the resonance frequency of the antenna L and the first capacitor C1 may be about 13.56 megahertz (MHz).

The second capacitor C2 may be coupled between the first node N1 and the first power electrode L1. The third capacitor C3 may be coupled between the second node N2 and the second power electrode L2.

When the resonance circuit 100*a* receives an electromagnetic wave EMW, which has a frequency corresponding to the resonance frequency, from an external NFC reader, a mutual induction may occur between the resonance circuit 100*a* and the external NFC reader. Therefore, an induced voltage may be generated at the first node N1 and the second node N2, which correspond to terminals of the antenna L.

The induced voltage generated at the first node N1 may be provided to the first power electrode L1 through the second capacitor C2 as a first antenna voltage VAN1. The induced voltage generated at the second node N2 may be provided to the second power electrode L2 through the third capacitor C3 as a second antenna voltage VAN2.

Figure 3:
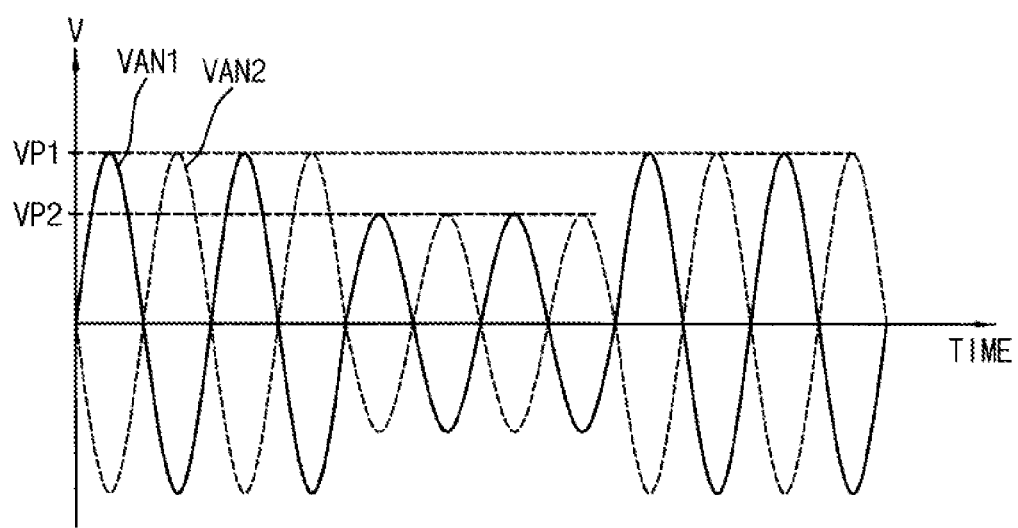
FIG. 3 is a graph illustrating a first antenna voltage and a second antenna voltage generated by a resonance circuit included in an NFC device of FIG. 2.

FIG. 3 is a graph illustrating a first antenna voltage and a second antenna voltage generated by a resonance circuit included in an NFC device of FIG. 2.

As described above, the induced voltage may be generated at the first node N1 and the second node N2 by a mutual induction between the resonance circuit 100*a* and the external NFC reader. Therefore, a magnitude of the induced voltage generated at the first node N1 may be the same as a magnitude of the induced voltage generated at the second node N2, and a phase of the induced voltage generated at the first node N1 may be different from a phase of the induced voltage generated at the second node N2 by 180 degrees.

Since the second capacitor C2 eliminates a direct current (DC) component of the induced voltage generated at the first node N1, the first antenna voltage VAN1 provided to the first power electrode L1 may include only an alternating current (AC) component.

Similarly, since the third capacitor C3 eliminates a DC component of the induced voltage generated at the second node N2, the second antenna voltage VAN2 provided to the second power electrode L2 may include only an AC component.

Therefore, as illustrated in FIG. 3, a magnitude of the first antenna voltage VAN1 may be the same as a magnitude of the second antenna voltage VAN2, and a phase of the first antenna voltage VAN1 may be different from a phase of the second antenna voltage VAN2 by 180 degrees.

In FIG. 3, a solid line graph represents the first antenna voltage VAN1, and a dotted line graph represents the second antenna voltage VAN2.

Since an amplitude shift keying (ASK) modulation is used to communicate data in the NFC scheme, the first antenna voltage VAN1 and the second antenna voltage VAN2 may have a first peak voltage VP1 and a second peak voltage VP2, respectively, based on modulated data.

As a distance between the NFC device 10*a* and the external NFC reader increases, the first peak voltage VP1 and the second peak voltage VP2, which respectively represent a magnitude of the first antenna voltage VAN1 and the second antenna voltage VAN2, may decrease. Alternately, as a distance between the NFC device 10*a* and the external NFC reader decreases, the first peak voltage VP1 and the second peak voltage VP2, which respectively represent a magnitude of the first antenna voltage VAN1 and the second antenna voltage VAN2, may increase.

In addition, as a size of the antenna L included in the resonance circuit 100*a* decreases, the first peak voltage VP1 and the second peak voltage VP2, which respectively represent a magnitude of the first antenna voltage VAN1 and the second antenna voltage VAN2, may decrease. Alternately, as a size of the antenna L included in the resonance circuit 100*a* increases, the first peak voltage VP1 and the second peak voltage VP2, which respectively represent a magnitude of the first antenna voltage VAN1 and the second antenna voltage VAN2, may increase.

Referring again to FIG. 2, the NFC chip 200*a* may include a demodulator 300, a central processing unit (CPU) 210, and a memory 220.

The demodulator 300 may receive the first antenna voltage VAN1 through the first power electrode L1, and may receive the second antenna voltage VAN2 through the second power electrode L2. The demodulator 300 may generate input data IDATA by demodulating the first antenna voltage VAN1 and the second antenna voltage VAN2, and may provide the input data IDATA to the CPU 210. The CPU 210 may store the input data IDATA in the memory 220.

Figure 4:
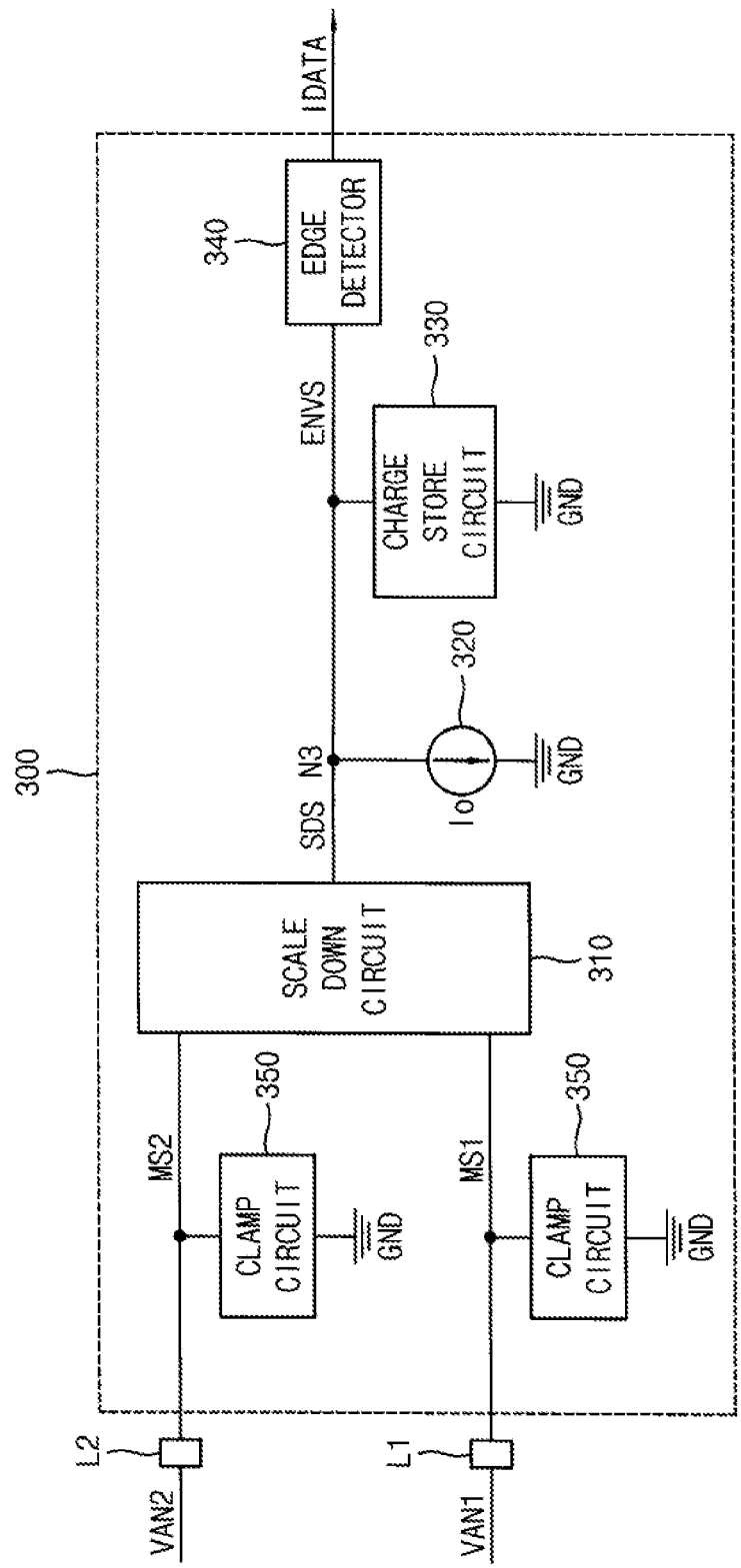
FIG. 4 is a block diagram illustrating an example embodiment of a demodulator included in an NFC device of FIG. 2.

FIG. 4 is a block diagram illustrating an example embodiment of a demodulator included in an NFC device of FIG. 2.

Referring to FIG. 4, the demodulator 300 may include a scale down circuit 310, a current source 320, a charge store circuit 330, an edge detector 340, and a voltage clamp circuit 350.

Although the voltage clamp circuit 350 is included in the demodulator 300 in FIG. 4, the voltage clamp circuit 350 may be outside of the demodulator 300 according to some example embodiments.

The voltage clamp circuit 350 may be coupled between the first power electrode L1 and a ground voltage GND, and between the second power electrode L2 and the ground voltage GND.

The voltage clamp circuit 350 may clamp the first antenna voltage VAN1, which is received through the first power electrode L1, to generate a first modulated signal MS1 at the first power electrode L1, and may clamp the second antenna voltage VAN2, which is received through the second power electrode L2, to generate a second modulated signal MS2 at the second power electrode L2.

In some example embodiments, the voltage clamp circuit 350 may generate the first modulated signal MS1 and the second modulated signal MS2 by clamping the first antenna voltage VAN1 and the second antenna voltage VAN2 at the ground voltage GND, respectively, such that the first antenna voltage VAN1 and the second antenna voltage VAN2 do not swing below the ground voltage GND.

The scale down circuit 310 may receive the first modulated signal MS1 and the second modulated signal MS2, which are generated at the first power electrode L1 and the second power electrode L2, respectively. The scale down circuit 310 may provide a scale down signal SDS to a third node N3 by scaling down a magnitude of the first modulated signal MS1 and a magnitude of the second modulated signal MS2.

In some example embodiments, the scale down circuit 310 may generate the scale down signal SDS by scaling down the magnitude of the first modulated signal MS1 and the magnitude of the second modulated signal MS2 at a same ratio. For example, the scale down circuit 310 may generate the scale down signal SDS by scaling down the magnitude of the first modulated signal MS1 and the magnitude of the second modulated signal MS2 by half. Therefore, a ratio of the magnitude of the first modulated signal MS1 and the second modulated signal MS2 to a magnitude of the scale down signal SDS may be constant.

The current source 320 may be coupled between the third node N3 and the ground voltage GND. The current source 320 may generate a constant current Io flowing from the third node N3 to the ground voltage GND.

The charge store circuit 330 may be coupled between the third node N3 and the ground voltage GND. The charge store circuit 330 may perform a charge operation and a discharge operation alternately based on the scale down signal SDS and the constant current Io to output an envelope signal ENVS, which corresponds to an envelope of the scale down signal SDS, through the third node N3.

The edge detector 340 may generate the input data IDATA, which correspond to the first antenna voltage VAN1 and the second antenna voltage VAN2, based on a transition of the envelope signal ENVS.

Figure 5:
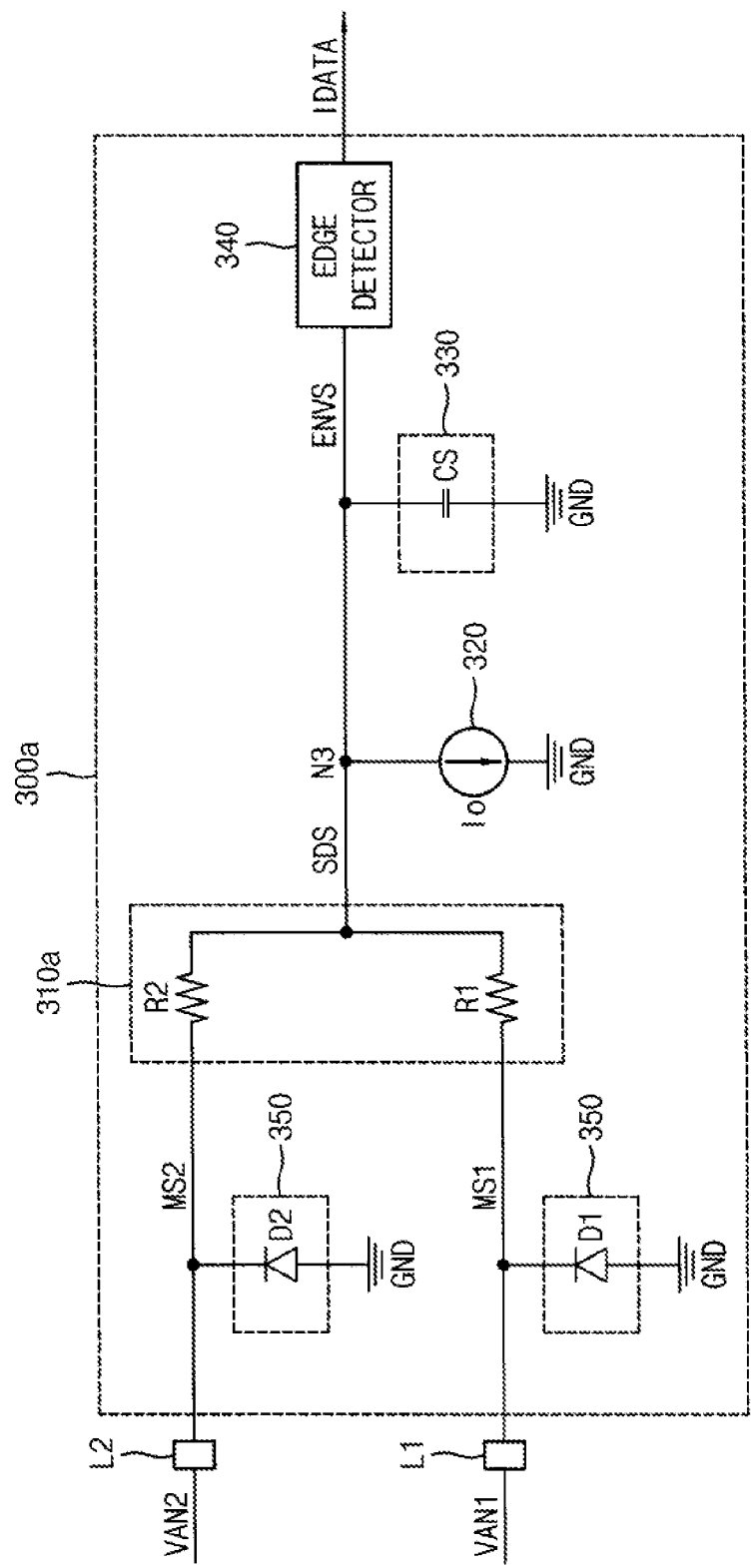
FIG. 5 is a circuit diagram illustrating an example embodiment of a demodulator of FIG. 4.
Figure 6:
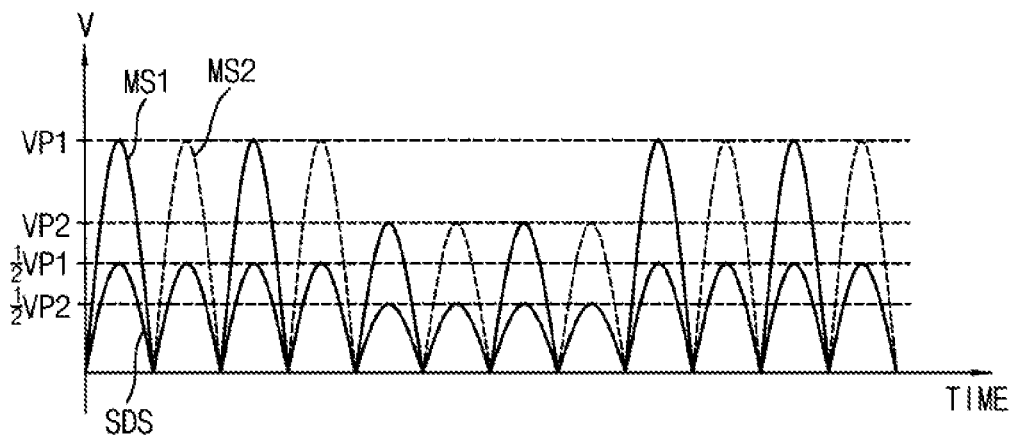
FIG. 6 is a graph illustrating a first modulated signal, a second modulated signal, and a scale down signal generated by a demodulator of FIG. 5.
Figure 7:
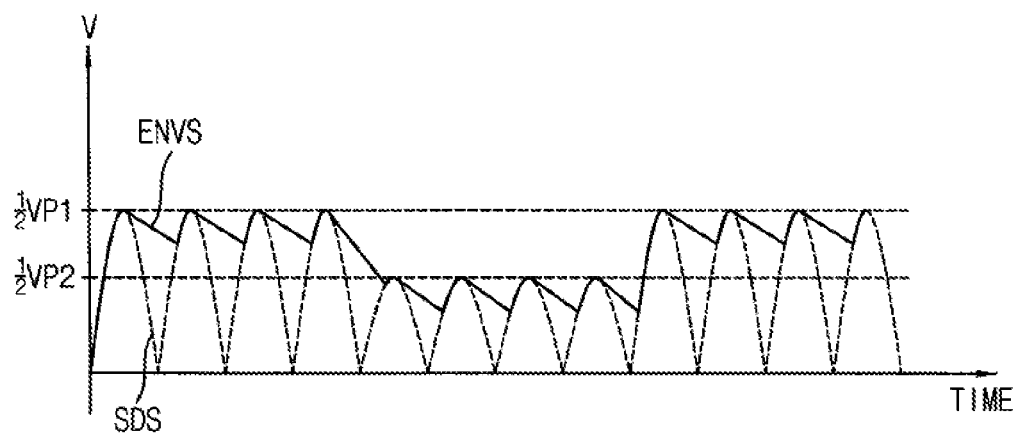
FIG. 7 is a graph illustrating an envelope signal generated by a demodulator of FIG. 5.

FIG. 5 is a circuit diagram illustrating an example embodiment of a demodulator of FIG. 4. FIG. 6 is a graph illustrating a first modulated signal, a second modulated signal, and a scale down signal generated by a demodulator of FIG. 5. FIG. 7 is a graph illustrating an envelope signal generated by a demodulator of FIG. 5.

Referring to FIG. 5, a demodulator 300a may include a scale down circuit 310a, a current source 320, a charge store circuit 330, an edge detector 340, and a voltage clamp circuit 350.

The voltage clamp circuit 350 may include a first diode D1 and a second diode D2.

The first diode D1 may include an anode coupled to the ground voltage GND and a cathode coupled to the first power electrode L1.

The second diode D2 may include an anode coupled to the ground voltage GND and a cathode coupled to the second power electrode L2.

As described above with reference to FIGS. 2 and 3, the first antenna voltage VAN1 and the second antenna voltage VAN2 provided to the first power electrode L1 and the second power electrode L2, respectively, by the resonance circuit 100a may include only an AC component.

Referring to FIGS. 3, 5, and 6, the first diode D1 may be turned off and the second diode D2 may be turned on during a period in which the first antenna voltage VAN1 has a positive voltage and the second antenna voltage VAN2 has a negative voltage. Since the first diode D1 is turned off, the first modulated signal MS1 may be substantially the same as the first antenna voltage VAN1. On the other hand, since the second diode D2 is turned on, the second power electrode L2 may be coupled to the ground voltage GND such that the second modulated signal MS2 may be substantially maintained at the ground voltage GND.

Similarly, the first diode D1 may be turned on and the second diode D2 may be turned off during a period in which the first antenna voltage VAN1 has a negative voltage and the second antenna voltage VAN2 has a positive voltage. Since the second diode D2 is turned off, the second modulated signal MS2 may be substantially the same as the second antenna voltage VAN2. On the other hand, since the first diode D1 is turned on, the first power electrode L1 may be coupled to the ground voltage GND such that the first modulated signal MS1 may be substantially maintained at the ground voltage GND.

Therefore, the first modulated signal MS1 and the second modulated signal MS2 may have wave forms as illustrated in FIG. 6.

As illustrated in FIG. 6, the magnitude of the first modulated signal MS1 may be the same as the magnitude of the second modulated signal MS2, and a phase of the first modulated signal MS1 may be different from a phase of the second modulated signal MS2 by 180 degrees.

Referring again to FIG. 5, the scale down circuit 310a may include a first resistor R1 and a second resistor R2.

The first resistor R1 may be coupled between the first power electrode L1 and the third node N3.

The second resistor R2 may be coupled between the second power electrode L2 and the third node N3.

In some example embodiments, a resistance of the first resistor R1 may be the same as a resistance of the second resistor R2.

The first resistor R1 may receive the first modulated signal MS1, and the second resistor R2 may receive the second modulated signal MS2.

As described above with reference to FIG. 6, the second modulated signal MS2 may be maintained at the ground voltage GND while the first modulated signal MS1 has a positive voltage, and the first modulated signal MS1 may be maintained at the ground voltage GND while the second modulated signal MS2 has a positive voltage.

Therefore, the first resistor R1 and the second resistor R2 may operate as a voltage divider for the first modulated signal MS1 and the second modulated signal MS2.

For example, since the resistance of the first resistor R1 is the same as the resistance of the second resistor R2, the first resistor R1 and the second resistor R2 may scale down the magnitude of the first modulated signal MS1 by half to generate the scale down signal SDS at the third node N3 while the first modulated signal MS1 has a positive voltage, and the first resistor R1 and the second resistor R2 may scale down the magnitude of the second modulated signal MS2 by half to generate the scale down signal SDS at the third node N3 while the second modulated signal MS2 has a positive voltage.

Therefore, as illustrated in FIG. 6, a peak voltage of the scale down signal SDS may correspond to a half of the first peak voltage VP1 of the first antenna voltage VAN1 and a half of the second peak voltage VP2 of the second antenna voltage VAN2.

Referring again to FIG. 5, the current source 320 may generate a constant current Io having a desired magnitude (that may or may not be predetermined) that flows from the third node N3 to the ground voltage GND. The magnitude of the constant current Io may be relatively small.

The charge store circuit 330 may include a storage capacitor CS coupled between the third node N3 and the ground voltage GND.

The storage capacitor CS may be charged and discharged based on the scale down signal SDS and the constant current Io. A voltage at the third node N3, which changes while the storage capacitor CS is charged and discharged, may correspond to the envelope signal ENVS.

For example, as illustrated in FIG. 7, when a voltage of the scale down signal SDS increases, the storage capacitor CS may be charged based on the scale down signal SDS. Therefore, the voltage at the third node N3 may increase along with the increase of the scale down signal SDS. When a voltage of the scale down signal SDS decreases, the storage capacitor CS may be slowly discharged based on the constant current Io. Therefore, the voltage at the third node N3 may not decrease along with the decrease of the scale down signal SDS, but may decrease more slowly. As a capacitance of the storage capacitor CS increases, a decreasing rate of the voltage at the third node N3 may decrease.

When the voltage at the third node N3 becomes the same as the voltage of the scale down signal SDS while the voltage at the third node N3 decreases slowly, the voltage at the third node N3 may increase along with the increase of the scale down signal SDS.

Therefore, as illustrated in FIG. 7, the envelope signal ENVS, which corresponds to the voltage at the third node N3, may represent an envelope of the scale down signal SDS.

Referring again to FIG. 5, the edge detector 340 may generate the input data IDATA, which corresponds to the first antenna voltage VAN1 and the second antenna voltage VAN2, based on a transition of the envelope signal ENVS.

The edge detector 340 may be implemented in various structures.

The edge detector 340 may be able to detect the transition of a voltage level of the envelope signal ENVS only when a voltage of the envelope signal ENVS is higher than a threshold voltage of the edge detector 340. When the voltage of the envelope signal ENVS is lower than the threshold voltage of the edge detector 340, the edge detector 340 may not detect the transition of the voltage level of the envelope signal ENVS such that the input data IDATA, which corresponds to the first antenna voltage VAN1 and the second antenna voltage VAN2, may not be generated.

In a general NFC device, an antenna voltage generated by a resonance circuit may be rectified by a rectifier, and then an envelope signal may be generated based on the rectified signal. Therefore, a magnitude of the envelope signal may be lower than a magnitude of the antenna voltage by a threshold voltage of the rectifier. As such, the general NFC device may be able to demodulate the antenna voltage to generate input data only when the magnitude of the antenna voltage is higher than a sum of a threshold voltage of the rectifier and a threshold voltage of an edge detector.

On the other hand, as described above with reference to FIGS. 1 to 7, the demodulator 300 may generate the scale down signal SDS by scaling down the magnitude of the first antenna voltage VAN1 and the magnitude of the second antenna voltage VAN2 by half, and may generate the input data IDATA by detecting the transition of the voltage level of the envelope signal ENVS, which corresponds to the envelope of the scale down signal SDS. Therefore, when a peak voltage of the antenna voltage VAN, which is generated by the resonance circuit 100, is higher than twice of a threshold voltage of the edge detector 340, the NFC device 10 according to some example embodiments may be able to receive data correctly from the external NFC reader. Since the NFC device 10 receives data correctly even in the case that the antenna voltage VAN generated by the resonance circuit 100 is relatively low, a communication distance of the NFC device 10 may be effectively increased.

In addition, since the NFC device 10 may generate the scale down signal SDS by scaling down the magnitude of the first antenna voltage VAN1 and the magnitude of the second antenna voltage VAN2 by half, and may generate the input data IDATA by detecting the transition of the voltage level of the envelope signal ENVS, which corresponds to the envelope of the scale down signal SDS, the NFC device 10 may be used regardless of the NFC transmission protocol. That is, the NFC device 10 may be used in any of the NFC transmission protocols including Type A, Type B, and Type F.

In addition, since the scale down circuit 310a is implemented with passive elements, a size of the NFC device 10 may be effectively reduced.

Therefore, a communication distance of the NFC device 10a of FIG. 2, including the demodulator 300a of FIG. 5, may be effectively increased, while the NFC device 10a may increase an accuracy of the demodulation. More generally, a communication distance of the NFC device 10 of FIG. 1, the NFC device 10a of FIG. 2, or the NFC device 10b of FIG. 13, including the demodulator 300 of FIG. 1, 2, or 4, may be effectively increased, while the NFC device 10, the NFC device 10a, or the NFC device 10b may increase an accuracy of the demodulation.

Figure 8:
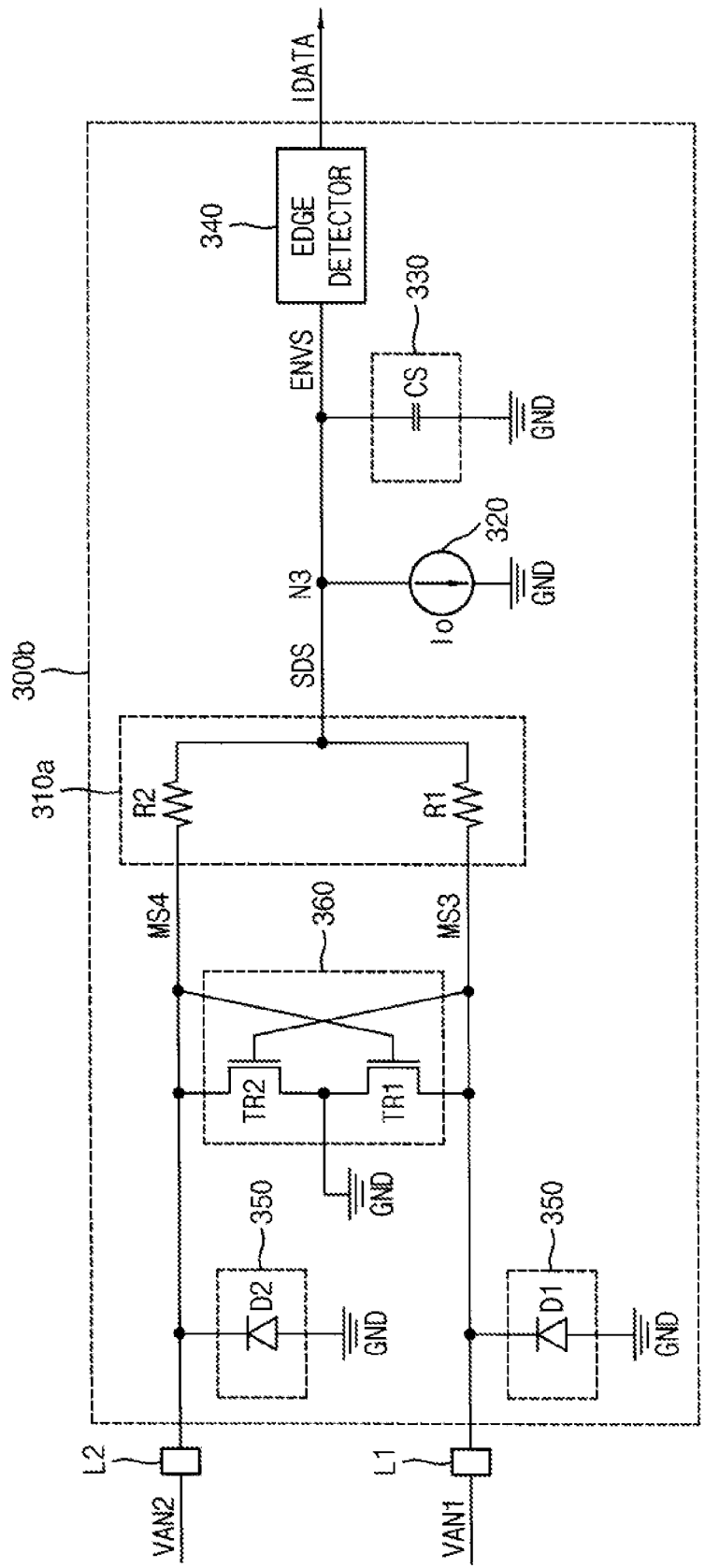
FIG. 8 is a circuit diagram illustrating an example embodiment of a demodulator of FIG. 4.

FIG. 8 is a circuit diagram illustrating an example embodiment of a demodulator of FIG. 4.

Referring to FIG. 8, a demodulator 300b may include a scale down circuit 310a, a current source 320, a charge store circuit 330, an edge detector 340, a voltage clamp circuit 350, and a bias circuit 360.

The demodulator 300b of FIG. 8 is the same as the demodulator 300a of FIG. 5, except that the demodulator 300b of FIG. 8 further includes the bias circuit 360 from the demodulator 300a of FIG. 5.

Referring to FIG. 8, the bias circuit 360 may be coupled to the first power electrode L1, the second power electrode L2, and the ground voltage GND. The bias circuit 360 may provide a bias voltage corresponding to the ground voltage GND to the first power electrode L1 and the second power electrode L2 to generate a third modulated signal MS3 at the first power electrode L1 and a fourth modulated signal MS4 at the second power electrode L2.

In some example embodiments, the bias circuit 360 may include a first n-type metal oxide semiconductor (NMOS) transistor TR1 and a second NMOS transistor TR2. The first NMOS transistor TR1 may include a drain coupled to the first power electrode L1, a source coupled to the ground voltage GND, and a gate coupled to the second power electrode L2. The second NMOS transistor TR2 may include a drain coupled to the second power electrode L2, a source coupled to the ground voltage GND, and a gate coupled to the first power electrode L1.

Figure 9:
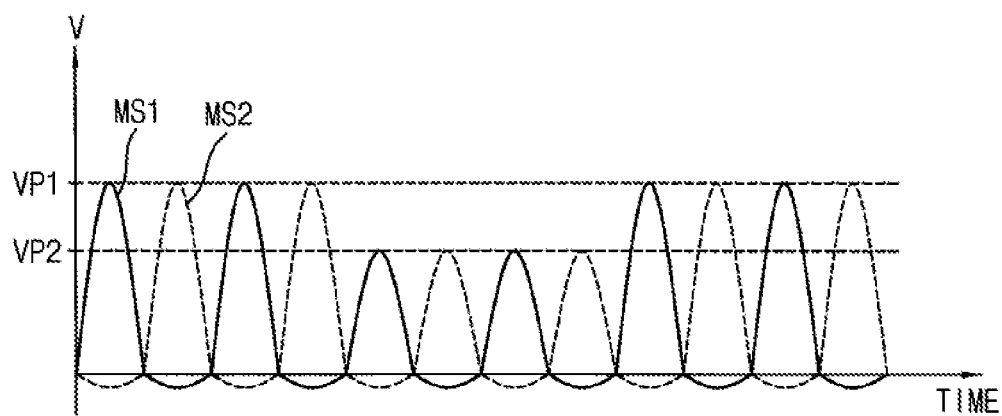
FIG. 9 is a graph illustrating a first modulated signal and a second modulated signal generated by a demodulator of FIG. 5.
Figure 10:
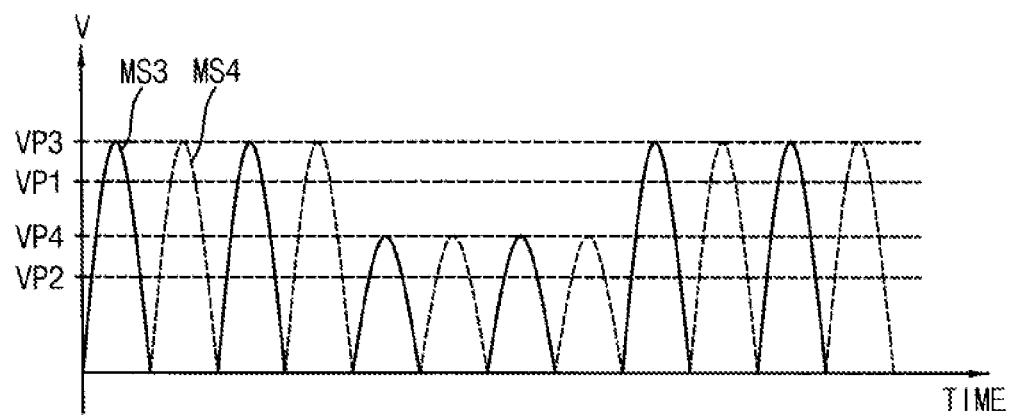
FIG. 10 is a graph illustrating a third modulated signal and a fourth modulated signal generated by a demodulator of FIG. 8.

FIG. 9 is a graph illustrating a first modulated signal and a second modulated signal generated by a demodulator of FIG. 5. FIG. 10 is a graph illustrating a third modulated signal and a fourth modulated signal generated by a demodulator of FIG. 8.

FIG. 9 illustrates wave forms of the first modulated signal MS1 and the second modulated signal MS2, which are generated by the voltage clamp circuit 350 included in the demodulator 300a of FIG. 5, in more detail.

Referring to FIGS. 5 and 9, the first diode D1 may be turned off and the second diode D2 may be turned on during a period in which the first antenna voltage VAN1 has a positive voltage and the second antenna voltage VAN2 has a negative voltage. Since the first diode D1 is turned off, the first modulated signal MS1 may be substantially the same as the first antenna voltage VAN1. Since the second diode D2 is turned on, a voltage drop corresponding to a threshold voltage of the second diode D2 may occur between the ground voltage GND and the second power electrode L2. Therefore, the second modulated signal MS2 may decrease below the ground voltage GND by the threshold voltage of the second diode D2.

Similarly, the first diode D1 may be turned on and the second diode D2 may be turned off during a period in which the first antenna voltage VAN1 has a negative voltage and the second antenna voltage VAN2 has a positive voltage. Since the second diode D2 is turned off, the second modulated signal MS2 may be substantially the same as the second antenna voltage VAN2. Since the first diode D1 is turned on, a voltage drop corresponding to a threshold voltage of the first diode D1 may occur between the ground voltage GND and the first power electrode L1. Therefore, the first modulated signal MS1 may decrease below the ground voltage GND by the threshold voltage of the first diode D1.

Referring to FIGS. 8 and 10, the first NMOS transistor TR1 may be turned off and the second NMOS transistor TR2 may be turned on during a period in which the first antenna voltage VAN1 has a positive voltage and the second antenna voltage VAN2 has a negative voltage. Therefore, the second power electrode L2 may be biased to the ground voltage GND.

Similarly, the first NMOS transistor TR1 may be turned on and the second NMOS transistor TR2 may be turned off during a period in which the first antenna voltage VAN1 has a negative voltage and the second antenna voltage VAN2 has a positive voltage. Therefore, the first power electrode L1 may be biased to the ground voltage GND.

As described above, since the first power electrode L1 and the second power electrode L2 are biased to the ground voltage GND by the bias circuit 360, the third modulated signal MS3 and the fourth modulated signal MS4, which are generated at the first power electrode L1 and the second power electrode L2, respectively, may not decrease below the ground voltage GND.

Therefore, as illustrated in FIGS. 9 and 10, the third modulated signal MS3 and the fourth modulated signal MS4, which are generated by the demodulator 300b of FIG. 8, may correspond to a shifted version of the first modulated signal MS1 and the second modulated signal MS2, which are generated by the demodulator 300a of FIG. 5, toward a positive direction. For example, while the first modulated signal MS1 and the second modulated signal MS2 have the first peak voltage VP1 and the second peak voltage VP2, the third modulated signal MS3 and the fourth modulated signal MS4 may have a third peak voltage VP3 and a fourth peak voltage VP4, which are higher than the first peak voltage VP1 and the second peak voltage VP2, respectively.

As described above with reference to FIGS. 8, 9, and 10, the demodulator 300b may generate the third modulated signal MS3 and the fourth modulated signal MS4 having a magnitude greater than the first antenna voltage VAN1 and the second antenna voltage VAN2. Since the scale down circuit 310a, the current source 320, the charge store circuit 330, and the edge detector 340 included in the demodulator 300b may generate the input data IDATA by demodulating the third modulated signal MS3 and the fourth modulated signal MS4 having an increased magnitude, a communication distance of the NFC device 10 including the demodulator 300b may be further increased.

Therefore, a communication distance of the NFC device 10a of FIG. 2, including the demodulator 300b of FIG. 8, may be effectively increased, while the NFC device 10a increases an accuracy of the demodulation. More generally, a communication distance of the NFC device 10 of FIG. 1, the NFC device 10a of FIG. 2, or the NFC device 10b of FIG. 13, including the demodulator 300 of FIG. 1, 2, or 4, may be effectively increased, while the NFC device 10, the NFC device 10a, or the NFC device 10b may increase an accuracy of the demodulation.

Figure 11:
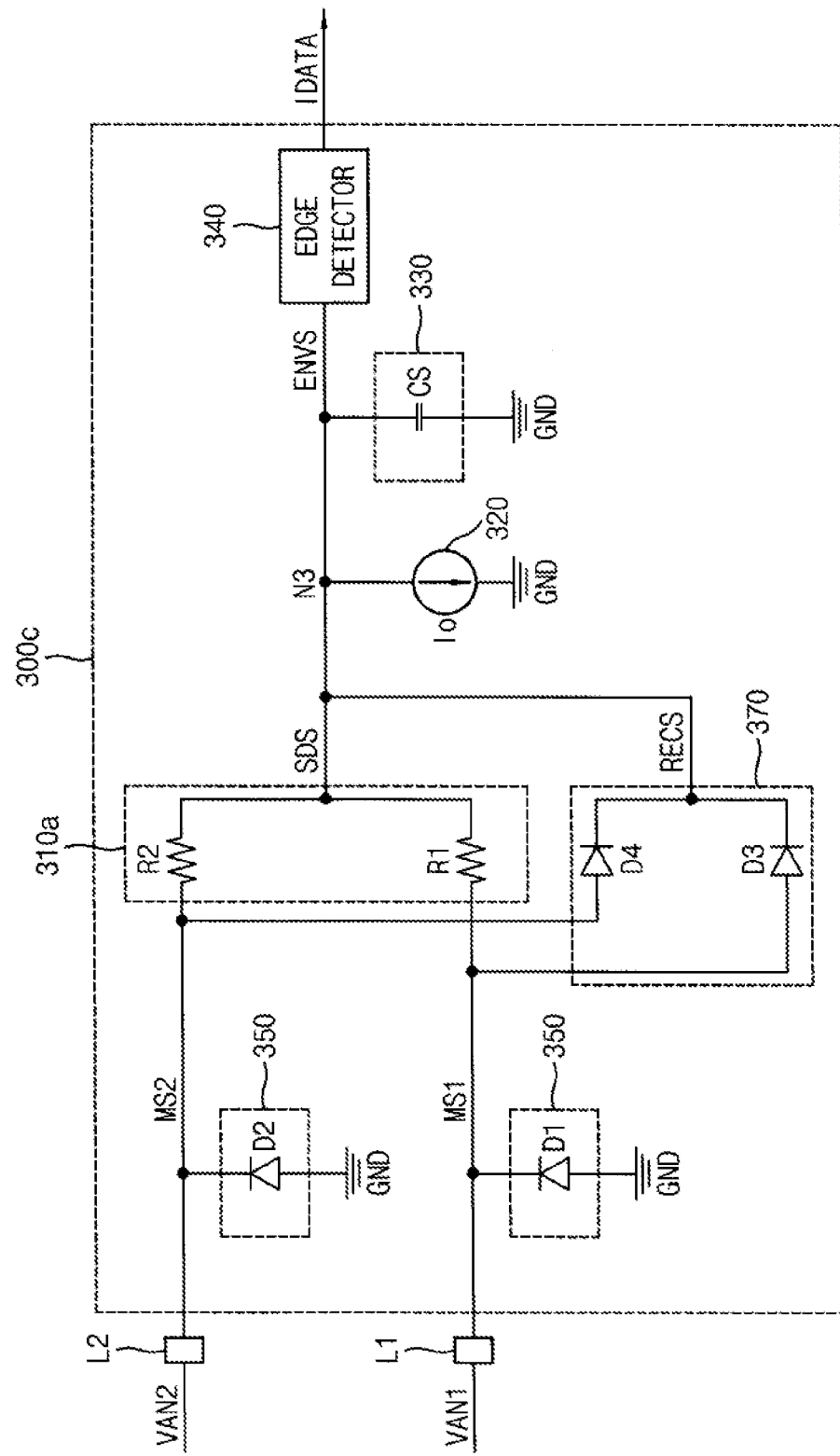
FIG. 11 is a circuit diagram illustrating an example embodiment of a demodulator of FIG. 4.

FIG. 11 is a circuit diagram illustrating an example embodiment of a demodulator of FIG. 4.

Referring to FIG. 11, a demodulator 300c may include a scale down circuit 310a, a current source 320, a charge store circuit 330, an edge detector 340, a voltage clamp circuit 350, and a rectification circuit 370.

The demodulator 300c of FIG. 11 is the same as the demodulator 300a of FIG. 5, except that the demodulator 300c of FIG. 11 further includes the rectification circuit 370 from the demodulator 300a of FIG. 5.

Referring to FIG. 11, the rectification circuit 370 may receive the first modulated signal MS1 and the second modulated signal MS2 from the first power electrode L1 and the second power electrode L2, respectively, and may provide a rectified signal RECS to the third node N3 by rectifying the first modulated signal MS1 and the second modulated signal MS2.

In some example embodiments, the rectification circuit 370 may include a third diode D3 and a fourth diode D4.

The third diode D3 may be coupled between the first power electrode L1 and the third node N3.

The fourth diode D4 may be coupled between the second power electrode L2 and the third node N3.

In some example embodiments, a threshold voltage of the third diode D3 may be the same as a threshold voltage of the fourth diode D4.

Figure 12:
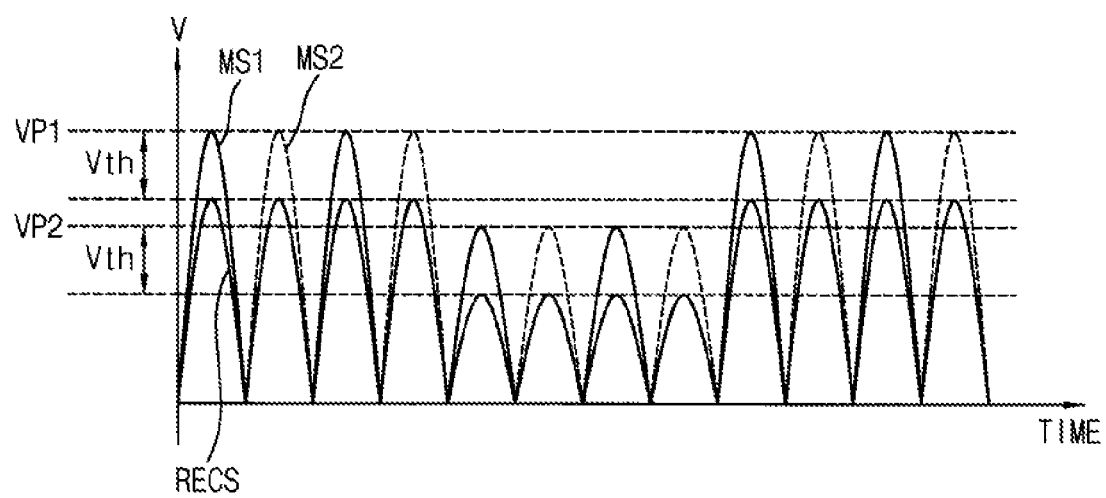
FIG. 12 is a graph illustrating a rectified signal generated by a rectification circuit included in a demodulator of FIG. 11.

FIG. 12 is a graph illustrating a rectified signal generated by a rectification circuit included in a demodulator of FIG. 11.

In FIG. 12, the rectified signal RECS generated by the rectification circuit 370 is illustrated in the case that the magnitude of the first modulated signal MS1 and the second modulated signal MS2 is greater than a threshold voltage Vth of the third diode D3 and the fourth diode D4.

Referring to FIGS. 11 and 12, the third diode D3 may be turned on and the fourth diode D4 may be turned off during a period in which the first modulated signal MS1 has a positive voltage and the second modulated signal MS2 has a negative voltage. Therefore, as illustrated in FIG. 12, the rectification circuit 370 may provide a voltage, which is lower than the first modulated signal MS1 by the threshold voltage Vth of the third diode D3, to the third node N3 as the rectified signal RECS.

Similarly, the third diode D3 may be turned off and the fourth diode D4 may be turned on during a period in which the first modulated signal MS1 has a negative voltage and the second modulated signal MS2 has a positive voltage. Therefore, as illustrated in FIG. 12, the rectification circuit 370 may provide a voltage, which is lower than the second modulated signal MS2 by the threshold voltage Vth of the fourth diode D4, to the third node N3 as the rectified signal RECS.

As described above, when the first peak voltage VP1 and the second peak voltage VP2 of the first modulated signal MS1 and the second modulated signal MS2 are higher than the threshold voltage Vth of the third diode D3 and the fourth diode D4, the rectified signal RECS generated by the rectification circuit 370 may correspond to a signal that is lower than the first modulated signal MS1 and the second modulated signal MS2 by the threshold voltage Vth of the third diode D3 and the fourth diode D4. In addition, the scale down signal SDS generated by the scale down circuit 310a may correspond to a half of the first modulated signal MS1 and the second modulated signal MS2.

Therefore, when the first peak voltage VP1 and the second peak voltage VP2 of the first modulated signal MS1 and the second modulated signal MS2 are sufficiently higher than the threshold voltage Vth of the third diode D3 and the fourth diode D4, a peak voltage of the rectified signal RECS may be higher than a peak voltage of the scale down signal SDS. As such, the storage capacitor CS may generate the envelope signal ENVS corresponding to an envelope of the rectified signal RECS. When the envelope signal ENVS is generated based on the rectified signal RECS, a ripple included in the envelope signal ENVS may be reduced compared to the case that the envelope signal ENVS is generated based on the scale down signal SDS.

On the other hand, when the first peak voltage VP1 and the second peak voltage VP2 of the first modulated signal MS1 and the second modulated signal MS2 are lower than the threshold voltage Vth of the third diode D3 and the fourth diode D4, the third diode D3 and the fourth diode D4 may be turned off such that the rectification circuit 370 may not output the rectified signal RECS.

Therefore, when the first peak voltage VP1 of the first modulated signal MS1 and the second peak voltage VP2 of the second modulated signal MS2 are lower than the threshold voltage Vth of the third diode D3 and the fourth diode D4, the storage capacitor CS may generate the envelope signal ENVS corresponding to an envelope of the scale down signal SDS.

As such, the demodulator 300c of FIG. 11 may generate the input data IDATA based on the rectified signal RECS, which is generated by the rectification circuit 370, when the magnitude of the first antenna voltage VAN1 and the second antenna voltage VAN2 is relatively large, and may generate the input data IDATA based on the scale down signal SDS, which is generated by the scale down circuit 310a, when the magnitude of the first antenna voltage VAN1 and the second antenna voltage VAN2 is relatively small.

Therefore, a communication distance of the NFC device 10a of FIG. 2, including the demodulator 300c of FIG. 11, may be effectively increased, while the NFC device 10a increases an accuracy of the demodulation. More generally, a communication distance of the NFC device 10 of FIG. 1, the NFC device 10a of FIG. 2, or the NFC device 10b of FIG. 13, including the demodulator 300 of FIG. 1, 2, or 4, may be effectively increased, while the NFC device 10, the NFC device 10a, or the NFC device 10b may increase an accuracy of the demodulation.

Those skilled in the art will recognize that the NFC device 10, the NFC device 10a, or the NFC device 10b may include both the bias circuit 360 of the demodulator 300b of FIG. 8, as well as the rectification circuit 370 of the demodulator 300c of FIG. 11.

Figure 13:
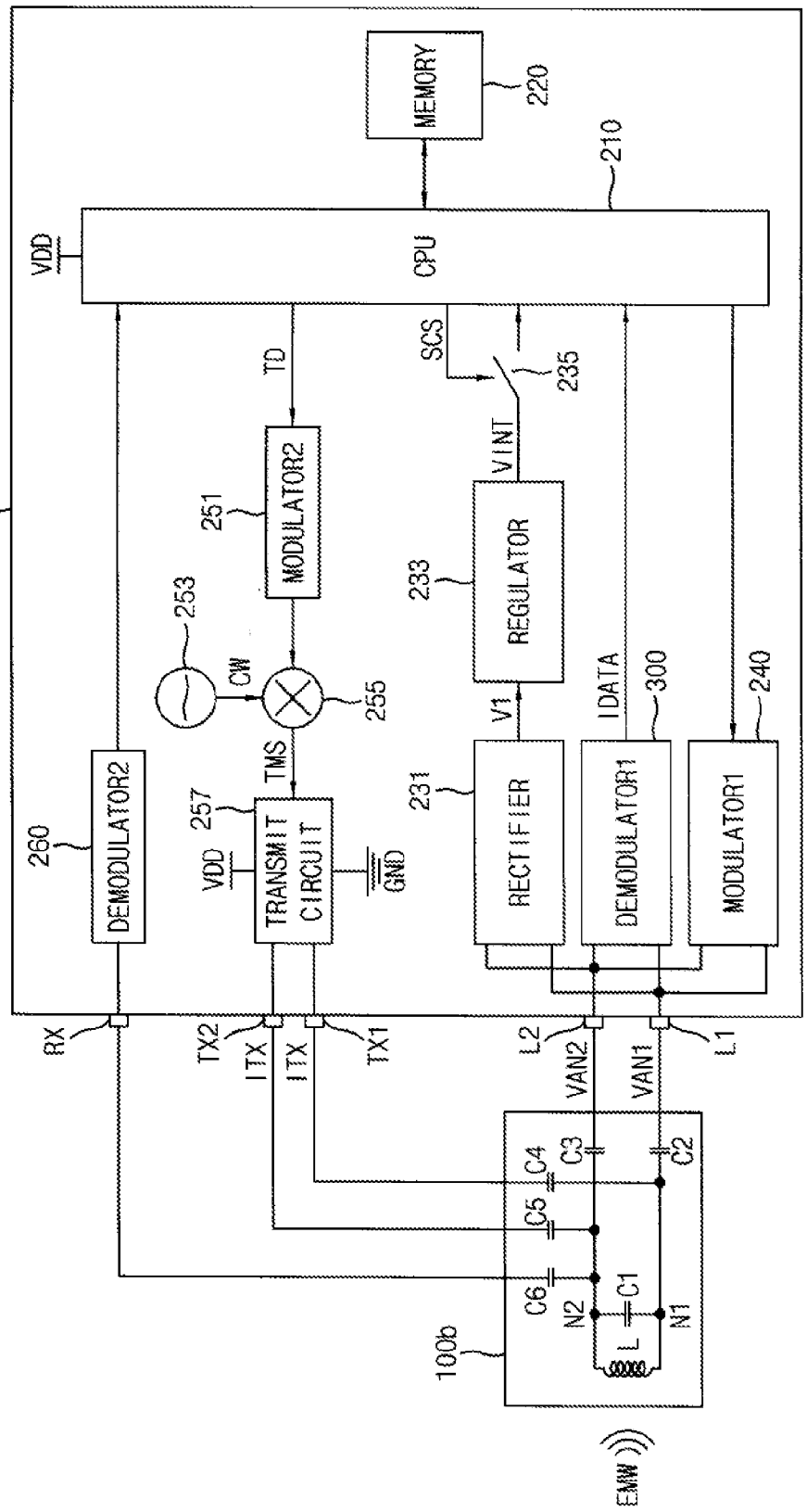
FIG. 13 is a block diagram illustrating an example embodiment of an NFC device of FIG. 1.

FIG. 13 is a block diagram illustrating an example embodiment of an NFC device of FIG. 1.

Referring to FIG. 13, an NFC device 10b may include a resonance circuit 100b and an NFC chip 200b.

The NFC chip 200b may be connected to the resonance circuit 100b through a first power electrode L1, a second power electrode L2, a first transmission electrode TX1, a second transmission electrode TX2, and a reception electrode RX.

The resonance circuit 100b may include an antenna L, a first capacitor C1, a second capacitor C2, a third capacitor C3, a fourth capacitor C4, a fifth capacitor C5, and a sixth capacitor C6.

The antenna L and the first capacitor C1 may be coupled in parallel between a first node N1 and a second node N2.

The antenna L and the first capacitor C1 may have a resonance frequency. In some example embodiments, the resonance frequency of the antenna L and the first capacitor C1 may be about 13.56 MHz.

The second capacitor C2 may be coupled between the first node N1 and the first power electrode L1. The third capacitor C3 may be coupled between the second node N2 and the second power electrode L2.

The fourth capacitor C4 may be coupled between the first node N1 and the first transmission electrode TX1. The fifth capacitor C5 may be coupled between the second node N2 and the second transmission electrode TX2.

The sixth capacitor C6 may be coupled between the second node N2 and the reception electrode RX.

The structure of the resonance circuit 100b illustrated in FIG. 13 is an example embodiment only, and the structure of the resonance circuit 100b according to some example embodiments may not be limited thereto, but may be variously modified.

The NFC chip 200b may perform a transmit operation and a receive operation through the first power electrode L1 and the second power electrode L2 in the card mode, may perform a transmit operation through the first transmission electrode TX1 and the second transmission electrode TX2 in the reader mode, and may perform a receive operation through the reception electrode RX in the reader mode.

The NFC chip 200b may provide an output current ITX to the resonance circuit 100b through the first transmission electrode TX1 and the second transmission electrode TX2, and may receive the antenna voltage VAN from the resonance circuit 100b through the first power electrode L1 and the second power electrode L2.

The NFC chip 200b may include a rectifier 231, a regulator 233, a power switch 235, a first demodulator 300, a first modulator 240, a central processing unit (CPU) 210, a memory 220, a second demodulator 260, a second modulator 251, an oscillator 253, a mixer 255, and a transmit circuit 257.

The rectifier 231 may generate a first voltage V1, which may be a DC voltage, by rectifying the first antenna voltage VAN1 and the second antenna voltage VAN2 provided from the resonance circuit 100b through the first power electrode L1 and the second power electrode L2.

The regulator 233 may generate an internal voltage VINT, which has a voltage level of a desired magnitude (that may or may not be predetermined) usable in the NFC chip 200b, using the first voltage V1.

The CPU 210 may control the overall operation of the NFC chip 200b. The CPU 210 may operate using a supply voltage VDD provided from a power source, such as a battery. In addition, the CPU 210 may receive the internal voltage VINT from the regulator 233 through the power switch 235. When the supply voltage VDD is equal to or higher than a desired voltage level (that may or may not be predetermined), the CPU 210 may operate using the supply voltage VDD and may disable a switch control signal SCS to turn off the power switch 235. When the supply voltage VDD is lower than the desired voltage level (that may or may not be predetermined), the CPU 210 may enable the switch control signal SCS to turn on the power switch 235 such that the CPU 210 may operate using the internal voltage VINT provided from the regulator 233.

When the NFC chip 200b performs the receive operation in the card mode, the first demodulator 300 may generate an input data IDATA by demodulating the first antenna voltage VAN1 and the second antenna voltage VAN2 provided from the resonance circuit 100b through the first power electrode L1 and the second power electrode L2, and may provide the input data IDATA to the CPU 210. The CPU 210 may store the input data IDATA in the memory 220.

The first demodulator 300 included in the NFC device 10b of FIG. 13 may be implemented with the demodulator 300 included in the NFC device 10a of FIG. 2. A structure and an operation of the demodulator 300 included in the NFC device 10a of FIG. 2 are described above with reference to FIGS. 1 to 12. Therefore, a detail description of the first demodulator 300 included in the NFC device 10b of FIG. 13 will be omitted.

When the NFC chip 200b performs the transmit operation in the card mode, the CPU 210 may read out an output data from the memory 220 to provide the output data to the first modulator 240 and the first modulator 240 may modulate the output data to provide a modulation signal to the first power electrode L1 and the second power electrode L2. For instance, the first modulator 240 may generate the modulation signal by performing a load modulation on the output data.

When the NFC chip 200b performs the receive operation in the reader mode, the second demodulator 260 may generate an input data by demodulating a signal provided from the resonance circuit 100b through the reception electrode RX to provide the input data to the CPU 210. The CPU 210 may store the input data in the memory 220.

When the NFC chip 200b performs the transmit operation in the reader mode, the CPU 210 may read out an output data TD from the memory 220 to provide the output data TD to the second modulator 251, the second modulator 251 may modulate the output data TD to generate a modulation signal, the oscillator 253 may generate a carrier signal CW having a carrier frequency (e.g., 13.56 MHz), and the mixer 255 may generate a transmission modulation signal TMS by synthesizing the carrier signal CW with the modulation signal.

The transmit circuit 257 may be coupled between the supply voltage VDD and the ground voltage GND.

In the reader mode, the transmit circuit 257 may provide the output current ITX, which corresponds to the transmission modulation signal TMS received from the mixer 255, to the resonance circuit 100b through the first transmission electrode TX1 and the second transmission electrode TX2, and the resonance circuit 100b may emit the electromagnetic wave EMW having a magnitude corresponding to the output current ITX.

In some example embodiments, in the reader mode, the transmit circuit 257 may provide the output current ITX corresponding to the transmission modulation signal TMS to the resonance circuit 100b through the first transmission electrode TX1 and the second transmission electrode TX2 by connecting the first transmission electrode TX1 and the second transmission electrode TX2 to the supply voltage VDD through a pull-up load or to the ground voltage GND through a pull-down load based on the transmission modulation signal TMS.

For example, in the reader mode, the transmit circuit 257 may connect the first transmission electrode TX1 to the supply voltage VDD through the pull-up load and may connect the second transmission electrode TX2 to the ground voltage GND through the pull-down load, or may connect the first transmission electrode TX1 to the ground voltage GND through the pull-down load and may connect the second transmission electrode TX2 to the supply voltage VDD through the pull-up load based on the transmission modulation signal TMS to provide the output current ITX corresponding to the transmission modulation signal TMS to the resonance circuit 100b through the first transmission electrode TX1 and the second transmission electrode TX2.

When the transmit circuit 257 connects the first transmission electrode TX1 to the supply voltage VDD through the pull-up load and connects the second transmission electrode TX2 to the ground voltage GND through the pull-down load, the output current ITX may be generated from the supply voltage VDD, may be provided to the resonance circuit 100b through the first transmission electrode TX1, and may be sunk to the ground voltage GND through the second transmission electrode TX2.

When the transmit circuit 257 connects the first transmission electrode TX1 to the ground voltage GND through the pull-down load and connects the second transmission electrode TX2 to the supply voltage VDD through the pull-up load, the output current ITX may be generated from the supply voltage VDD, may be provided to the resonance circuit 100b through the second transmission electrode TX2, and may be sunk to the ground voltage GND through the first transmission electrode TX1.

Figure 14:
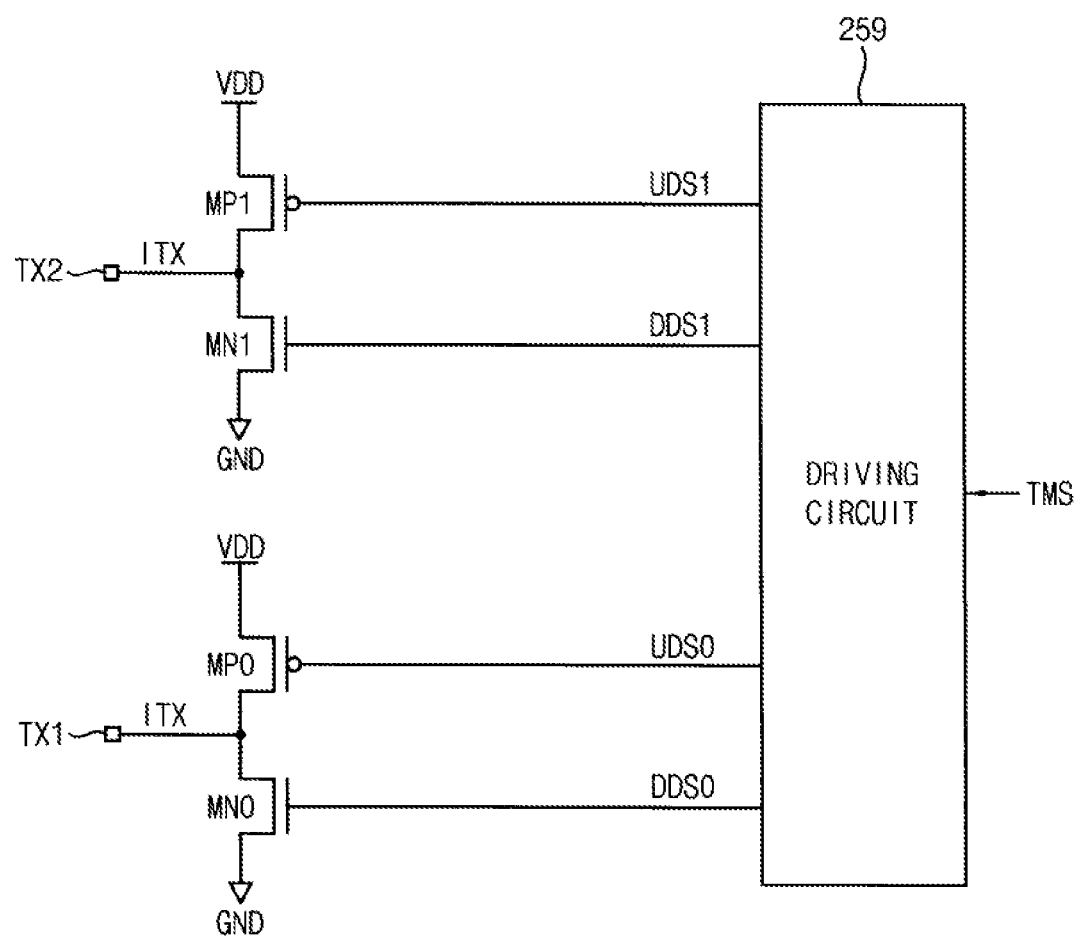
FIG. 14 is a block diagram illustrating an example embodiment of a transmit circuit included in an NFC device of FIG. 13.

FIG. 14 is a block diagram illustrating an example embodiment of a transmit circuit included in an NFC device of FIG. 13.

Referring to FIG. 14, the transmit circuit 257 may include a first pull-up transistor MP0, a second pull-up transistor MP1, a first pull-down transistor MN0, a second pull-down transistor MN1, and a driving circuit 259.

The first pull-up transistor MP0 and the second pull-up transistor MP1 may be p-type metal oxide semiconductor (PMOS) transistors. The first pull-down transistor MN0 and the second pull-down transistor MN1 may be NMOS transistors.

The first pull-up transistor MP0 may be coupled between the supply voltage VDD and the first transmission electrode TX1, and the first pull-down transistor MN0 may be coupled between the first transmission electrode TX1 and the ground voltage GND.

The second pull-up transistor MP1 may be coupled between the supply voltage VDD and the second transmission electrode TX2, and the second pull-down transistor MN1 may be coupled between the second transmission electrode TX2 and the ground voltage GND.

The driving circuit 259 may drive the first pull-up transistor MP0 using a first pull-up driving signal UDS0, may drive the first pull-down transistor MN0 using a first pull-down driving signal DDS0, may drive the second pull-up transistor MP1 using a second pull-up driving signal UDS1, and may drive the second pull-down transistor MN1 using a second pull-down driving signal DDS1.

The driving circuit 259 may turn on one of the first pull-up transistor MP0 and the first pull-down transistor MN0, and may turn on one of the second pull-up transistor MP1 and the second pull-down transistor MN1, based on the transmission modulation signal TMS.

For example, the driving circuit 259 may turn on the first pull-up transistor MP0 and the second pull-down transistor MN1 and turn off the second pull-up transistor MP1 and the first pull-down transistor MN0, or may turn on the second pull-up transistor MP1 and the first pull-down transistor MN0 and turn off the first pull-up transistor MP0 and the second pull-down transistor MN1, based on the transmission modulation signal TMS to provide the output current ITX corresponding to the transmission modulation signal TMS to the resonance circuit 100b through the first transmission electrode TX1 and the second transmission electrode TX2.

As described above with reference to FIGS. 13 and 14, since the NFC device 10b performs the receive operation using the first demodulator 300 in the card mode, the NFC device 10b may be able to receive data correctly even in the case that the first antenna voltage VAN1 and the second antenna voltage VAN2 generated by the resonance circuit 100b are relatively low. As such, a communication distance of the NFC device 10b may be effectively increased.

Figure 15:
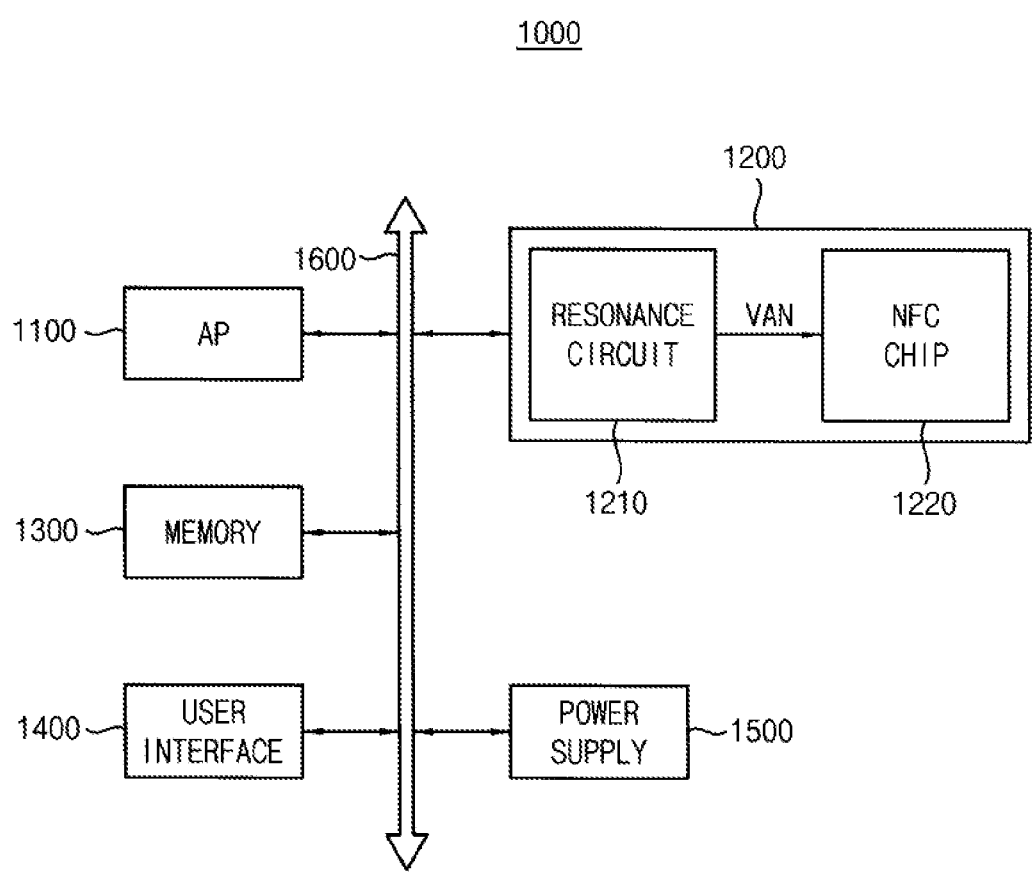
FIG. 15 is a block diagram illustrating an electronic device according to some example embodiments.

FIG. 15 is a block diagram illustrating an electronic device according to some example embodiments.

Referring to FIG. 15, an electronic device 1000 may include an application processor (AP) 1100, an NFC device 1200, a memory device 1300, a user interface 1400, a power supply 1500, and a bus 1600. In some example embodiments, the electronic device 1000 may be an arbitrary mobile system, such as a mobile phone, a smart phone, a personal digital assistant (PDA), a portable multimedia player (PMP), a digital camera, a camcorder, a music player, a portable game console, a navigation system, etc.

The application processor 1100 may control overall operations of the electronic device 1000. The application processor 1100 may execute applications, such as a web browser, a game application, a video player, etc. In some example embodiments, the application processor 1100 may include a single core or multiple cores. For example, the application processor 1100 may be a multi-core processor, such as a dual-core processor, a quad-core processor, a hexa-core processor, etc. The application processor 1100 may include an internal or external cache memory.

The memory device 1300 may store various data. For example, the memory device 1300 may store output data to be transmitted to an external device and input data received from the external device. In some example embodiments, the memory device 1300 may be an electrically erasable programmable read-only memory (EEPROM), a flash memory, a phase-change random access memory (PRAM), a resistance random access memory (RRAM), a nano floating gate memory (NFGM), a polymer random access memory (PoRAM), a magnetic random access memory (MRAM), a ferroelectric random access memory (FRAM), etc.

The NFC device 1200 may transmit the output data stored in the memory device 1300 to an external device through NFC. The NFC device 1200 may receive input data from the external device through NFC to store the input data in the memory device 1300.

The NFC device 1200 may include a resonance circuit 1210 and an NFC chip 1220. The resonance circuit 1210 may generate an antenna voltage VAN based on an electromagnetic wave EMW received from the external device. The NFC chip 1220 may include a demodulator that demodulates the antenna voltage VAN to generate the input data. The demodulator may receive the antenna voltage VAN from the resonance circuit 1210, may generate a scale down signal by scaling down a magnitude of the antenna voltage VAN, may generate an envelope signal corresponding to an envelope of the scale down signal, and may generate the input data corresponding to the antenna voltage VAN based on the envelope signal.

The NFC device 1200 may be implemented with the NFC device 10 of FIG. 1. A structure and an operation of the NFC device 10 of FIG. 1 are described above with reference to FIGS. 1 to 14. Therefore, a detail description of the NFC device 1200 of FIG. 15 will be omitted.

The user interface 1400 may include at least one input device, such as a keypad, a touch screen, etc., and at least one output device, such as a speaker, a display device, etc. The power supply 1500 may supply a power supply voltage to the electronic device 1000.

The application processor 1100, the NFC device 1200, the memory device 1300, the user interface 1400, and the power supply 1500 may communicate via the bus 1600.

In some example embodiments, the electronic device 1000 may further include an image processor, and/or a storage device, such as a memory card, a solid state drive (SSD), a hard disk drive (HDD), a compact disc, read-only memory (CD-ROM), etc.

In some example embodiments, the electronic device 1000 and/or components of the electronic device 1000 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi-chip package (MCP), wafer-level fabricated package (WFP), or wafer-level processed stack package (WSP).

Algorithms for implementation or control of the wireless communication technologies discussed in this application (e.g., for demodulators for NFC, NFC devices, and electronic devices including NFC devices) may be used for implementation or control of more general purpose apparatuses and/or methods of controlling apparatuses.

Methods for implementation or control of the wireless communication technologies discussed in this application may be written as computer programs and can be implemented in general-use digital computers that execute the programs using a computer-readable recording medium. In addition, a structure of data used in the methods may be recorded in a computer-readable recording medium in various ways. Examples of the computer-readable recording medium include storage media such as magnetic storage media (e.g., ROM (Read-Only Memory), RAM (Random-Access Memory), USB (Universal Serial Bus), floppy disks, hard disks, etc.) and optical recording media (e.g., CD-ROMs (Compact Disc Read-Only Memories) or DVDs (Digital Video Discs)).

In addition, some example embodiments may also be implemented through computer-readable code/instructions in/on a medium (e.g., a computer-readable medium) to control at least one processing element to implement some example embodiments. The medium may correspond to any medium/media permitting the storage and/or transmission of the computer-readable code.

The computer-readable code may be recorded/transferred on a medium in a variety of ways, with examples of the medium including recording media, such as magnetic storage media (e.g., ROM, floppy disks, hard disks, etc.) and optical recording media (e.g., CD-ROMs or DVDs), and transmission media such as Internet transmission media. Thus, the medium may be such a defined and measurable structure including or carrying a signal or information, such as a device carrying a bitstream according to some example embodiments. The media may also be a distributed network, so that the computer-readable code is stored/transferred and executed in a distributed fashion. Furthermore, the processing element could include a processor or a computer processor, and processing elements may be distributed and/or included in a single device.

In some example embodiments, some of the elements may be implemented as a 'module'. According to some example embodiments, 'module' may be interpreted as software-based components or hardware components, such as a field programmable gate array (FPGA) or an application specific integrated circuit (ASIC), and the module may perform certain functions. However, the module is not limited to software or hardware. The module may be configured so as to be placed in a storage medium which may perform addressing, or to execute one or more processes.

For example, modules may include components such as software components, object-oriented software components, class components, and task components, processes, functions, attributes, procedures, subroutines, segments of program code, drivers, firmware, microcodes, circuits, data, databases, data structures, tables, arrays, and variables. Functions provided from the components and the modules may be combined into a smaller number of components and modules, or be separated into additional components and modules. Moreover, the components and the modules may execute one or more central processing units (CPUs) in a device.

Some example embodiments may be implemented through a medium including computer-readable codes/instructions to control at least one processing element of the above-described embodiments, for example, a computer-readable medium. Such a medium may correspond to a medium/media that may store and/or transmit the computer-readable codes.

The computer-readable codes may be recorded in a medium or be transmitted over the Internet. For example, the medium may include a ROM, a RAM, a CD-ROM, a magnetic tape, a floppy disc, an optical recording medium, or a carrier wave such as data transmission over the Internet. Further, the medium may be a non-transitory computer-readable medium. Since the medium may be a distributed network, the computer-readable code may be stored, transmitted, and executed in a distributed manner. Further, for example, the processing element may include a processor or a computer processor, and be distributed and/or included in one device.

While the inventive concepts have been particularly shown and described with reference to some example embodiments thereof, it will be understood by those of ordinary skill in the art that various changes in forms and details may be made therein without departing from the spirit and scope of the inventive concepts as defined by the following claims.

It should be understood that example embodiments described herein should be considered in a descriptive sense only and not for purposes of limitation. Descriptions of features or aspects within example embodiments should typically be considered as available for other similar features or aspects in other example embodiments.

What is claimed is:

1. A demodulator for near field communication (NFC), the demodulator comprising:
    a scale down circuit configured to receive a first modulated signal and a second modulated signal from a first power electrode and a second power electrode, respectively, and configured to provide a scale down signal to a first node by scaling down a magnitude of the first modulated signal and a magnitude of the second modulated signal;
    a current source coupled between the first node and a ground voltage, and configured to generate a constant current flowing from the first node to the ground voltage;
    a charge store circuit coupled between the first node and the ground voltage, and configured to perform a charge operation and a discharge operation alternately, based on the scale down signal and the constant current, to output an envelope signal, which corresponds to an envelope of the scale down signal, through the first node; and
    an edge detector configured to generate input data, which correspond to the first modulated signal and the second modulated signal, based on a transition of the envelope signal.

2. The demodulator of claim 1, further comprising:
    a voltage clamp circuit configured to generate the first modulated signal and the second modulated signal by clamping a first antenna voltage and a second antenna voltage received from outside of the demodulator through the first power electrode and the second power electrode, respectively.

3. The demodulator of claim 2, wherein the voltage clamp circuit comprises:
    a first diode coupled between the first power electrode and the ground voltage; and
    a second diode coupled between the second power electrode and the ground voltage.

4. The demodulator of claim 1, wherein the magnitude of the first modulated signal is the same as the magnitude of the second modulated signal, and
    wherein a phase of the first modulated signal is different from a phase of the second modulated signal by 180 degrees.

5. The demodulator of claim 1, wherein the scale down circuit is further configured to generate the scale down signal by scaling down the magnitude of the first modulated signal and the magnitude of the second modulated signal by a same ratio.

6. The demodulator of claim 1, wherein the scale down circuit is further configured to generate the scale down signal by scaling down the magnitude of the first modulated signal and the magnitude of the second modulated signal by one half.

7. The demodulator of claim 1, wherein the scale down circuit comprises:
a first resistor coupled between the first power electrode and the first node; and
a second resistor coupled between the second power electrode and the first node.

8. The demodulator of claim 7, wherein a resistance of the first resistor is the same as a resistance of the second resistor.

9. The demodulator of claim 1, wherein the charge store circuit comprises:
a capacitor coupled between the first node and the ground voltage.

10. The demodulator of claim 1, further comprising:
a rectification circuit configured to receive the first modulated signal and the second modulated signal from the first power electrode and the second power electrode, respectively, and configured to provide a rectified signal to the first node by rectifying the first modulated signal and the second modulated signal.

11. The demodulator of claim 10, wherein the rectification circuit comprises:
a first diode coupled between the first power electrode and the first node; and
a second diode coupled between the second power electrode and the first node.

12. The demodulator of claim 11, wherein a threshold voltage of the first diode is the same as a threshold voltage of the second diode.

13. The demodulator of claim 1, further comprising:
a bias circuit coupled to the first power electrode, the second power electrode, and the ground voltage;
wherein the bias circuit is configured to provide bias voltage corresponding to the ground voltage to the first power electrode and the second power electrode.

14. The demodulator of claim 13, wherein the bias circuit comprises:
a first n-type metal oxide semiconductor (NMOS) transistor having a drain coupled to the first power electrode, a source coupled to the ground voltage, and a gate coupled to the second power electrode; and
a second NMOS transistor having a drain coupled to the second power electrode, a source coupled to the ground voltage, and a gate coupled to the first power electrode.

15. A demodulator, comprising:
a circuit configured to receive a first modulated signal from a first power electrode, configured to receive a second modulated signal from a second power electrode, configured to provide a scale down signal to a first node by scaling down a magnitude of the first modulated signal and a magnitude of the second modulated signal, configured to cause a constant current to flow from the first node to a ground voltage, configured to output an envelope signal, corresponding to an envelope of the scale down signal, through the first node, and configured to generate input data based on a transition of the envelope signal.

16. The demodulator of claim 15, wherein the circuit is further configured to alternately perform charging and discharging operations.

17. The demodulator of claim 16, wherein the charging operations are based on the scale down signal.

18. The demodulator of claim 16, wherein the charging operations are based on the constant current.

19. The demodulator of claim 16, wherein the discharging operations are based on the scale down signal.

20. The demodulator of claim 16, wherein the discharging operations are based on the constant current.

* * * * *